United States Patent
Tsen et al.

(10) Patent No.: US 8,334,685 B2
(45) Date of Patent: Dec. 18, 2012

(54) SIGNAL DETECTOR AND SIGNAL DETECTION METHOD

(75) Inventors: Ting-Chin Tsen, Taipei (TW); Shu-Chia Lin, Taipei (TW); Wen-Yueh Hsieh, Taipei (TW)

(73) Assignee: INNO-TECH Co., Ltd., Taipei (TW)

( * ) Notice: Subject to any disclaimer, the term of this patent is extended or adjusted under 35 U.S.C. 154(b) by 397 days.

(21) Appl. No.: 12/651,441

(22) Filed: Dec. 31, 2009

(65) Prior Publication Data

US 2010/0176794 A1 Jul. 15, 2010

(30) Foreign Application Priority Data

Jan. 14, 2009 (TW) .............................. 98101276 A

(51) Int. Cl.
*G01R 19/22* (2006.01)
*G01R 31/40* (2006.01)
*H03K 4/06* (2006.01)
(52) U.S. Cl. ..................... 324/120; 324/764.01; 327/135
(58) Field of Classification Search .......... 324/118–120, 324/764.01; 327/127, 135
See application file for complete search history.

(56) References Cited

U.S. PATENT DOCUMENTS

| | | | |
|---|---|---|---|
| 6,259,259 B1 * | 7/2001 | Raffalt et al. | 324/650 |
| 7,577,539 B2 * | 8/2009 | Hubanks et al. | 702/104 |
| 8,102,171 B2 * | 1/2012 | Reichel et al. | 324/76.19 |
| 8,134,390 B2 * | 3/2012 | Tsen et al. | 327/127 |
| 2006/0139032 A1 * | 6/2006 | Kalokitis et al. | 324/457 |
| 2009/0190376 A1 * | 7/2009 | Morita et al. | 363/19 |
| 2010/0164480 A1 * | 7/2010 | Morita et al. | 324/120 |

* cited by examiner

*Primary Examiner* — Joshua Benitez Rosario
(74) *Attorney, Agent, or Firm* — Lin & Associates IP, Inc.

(57) ABSTRACT

A signal detector and a signal detection method adapted for detecting a voltage signal are provided. According to a digital signal converted from a low voltage full wave or half wave signal and/or a mains AC signal inputted thereto, the signal detector and the signal detection method are capable of detecting a voltage level, and/or a frequency, and/or a zero point, and/or a phase of the low voltage full wave or half wave signal and/or the mains AC signal inputted thereto, and determining whether the detected factor is abnormal, and is further capable of outputting an interrupt signal for subsequent processing.

16 Claims, 6 Drawing Sheets

SIGNAL DETECTOR AND SIGNAL DETECTION METHOD

BACKGROUND OF THE INVENTION

1. Field of the Invention

The present invention relates generally to a signal detector and a signal detection method, and more particularly, to a signal detector and a signal detection method adapted for detecting a voltage signal. The signal detector of the present invention is configured in a manner of integrated circuit (IC), and is capable of detecting a voltage level, and/or a frequency, and/or a zero point, and/or a phase of a signal inputted thereto, and is further adapted for determining whether the detected factor is abnormal, and is further capable of outputting interrupt signal for subsequent processing.

2. The Prior Arts

Typically, a conventional voltage detection circuit includes an analog-to-digital converter (ADC), a timer, and a microcontroller unit (MCU) firmware. When such a conventional voltage detection circuit is used in detecting whether a voltage signal, e.g., a mains voltage signal, is normal, the ADC in the voltage detection circuit architecture, repetitively executes sampling/ converting operations to the voltage signal (e.g., attenuated and full-wave rectified mains voltage signal) for monitoring the level of the voltage signal. At least 16 times of sampling/converting operations are executed to each half-cycle of the voltage signal. A positive edge and a negative edge of a square wave signal (e.g., a square wave signal having a mains frequency) are taken serving as an initial signal of each half-cycle. For example, the time width of each half-cycle of the voltage signal is 8.33 ms (60 Hz mains power), or 10 ms (50 Hz mains power). Then, if the track of the voltage signal successively exceeds an upper threshold and a lower threshold, the voltage is determined as abnormal. Then, the timer is used for converting the square wave signal, for learning the frequency of the voltage signal (e.g., the attenuated and full-wave rectified mains voltage signal). Finally, if the frequency of the voltage signal successively exceeds a predetermined upper threshold and a predetermined lower threshold (e.g., 50 Hz ±3 Hz), the frequency is determined as abnormal.

However, in such a conventional voltage detection circuit architecture, the ADC is not an IC, and therefore the conventional voltage detection circuit has the disadvantage of a lower stability and is apt to be affected by environmental factors (e.g., operation temperature). Further, being of a non-integrated circuit, the ADC cannot be integrated with other ICs, and therefore is not adapted for system integration. As such the application of such a voltage detection circuit architecture is restricted.

In this concern, it is desired to develop an IC type voltage detection circuit, which is capable of detecting a factor of a voltage signal, such as a voltage level (e.g., 110V or 220V mains power) and/or a frequency (e.g., 60 Hz or 50 Hz mains power), and/or a zero point, and/or a phase, and determining whether the factor is abnormal, and is further capable of outputting interrupt signal for subsequent processing.

SUMMARY OF THE INVENTION

A primary objective of the present invention is to provide a signal detector and a signal detection method adapted for detecting a voltage signal. According to a digital signal converted from a low voltage full wave or half wave signal and/or a mains AC signal inputted thereto, the signal detector and the signal detection method is capable of detecting a voltage level, and/or a frequency, and/or a zero point, and/or a phase of the low voltage full wave or half wave signal and/or the mains AC signal inputted thereto, and determining whether the detected factor is abnormal, and is further capable of outputting interrupt signal for subsequent processing.

Another objective of the present invention is to provide a signal detector and a signal detection method adapted for detecting a voltage signal. The signal detector is configured in a manner of IC, and therefore can be integrated with other ICs, for improving the overall integrity of the system.

A further objective of the present invention is to provide a signal detector and a signal detection method adapted for detecting a voltage signal. The signal detector is integrated into a micro-controller unit (MCU).

For achieving the foregoing objectives and others, the present invention provides an IC type signal detector which can be integrated with other ICs. For example, the signal detector can be integrated into an MCU for improving the overall integrity of the system. The signal detector includes an analog-to-digital converter (ADC) module, a voltage detection module, a zero point module, a frequency detection module, and a register module. The ADC module and/or the voltage detector module and/or the zero point module and/or the frequency detection module and/or the register module is/are IC module(s)

The ADC module converts the inputted low voltage full wave or half wave signal and/or the mains AC signal into a digital signal. The digital signal is provided to the voltage detection module for determining the voltage level. The low voltage full wave or half wave and/or the mains AC signal can be any type of low voltage signal, and the type of the low voltage signal is not restricted hereby. For the convenience of illustration, the low voltage signal is exemplified as a mains voltage signal having a voltage of 110V or 220V and a frequency of 50 Hz or 60 Hz.

The low voltage square wave signal is inputted to the zero point module. The zero point module generates a zero point control signal and provides the zero point control signal to the voltage detection module and the frequency detection module for use. The low voltage square wave signal can be any type of low voltage signal, and the type of the low voltage signal is not restricted hereby. For the convenience of illustration, the low voltage square wave signal is exemplified as a square wave having a frequency equal to an attenuated or unattenuated high voltage signal (e.g., mains power). The low voltage square wave signal has a high level which is a positive half-cycle of the high voltage signal, and a low level which is a negative half-cycle of the high voltage signal. The low voltage square wave signal has a rise edge/fall edge which represents the time that the voltage of the high voltage signal is zero (e.g., zero point).

According to the zero point control signal provided by the zero point module and the digital signal obtained from the ADC module, the voltage detection module determines whether the low voltage full wave or half wave signal and/or the mains AC signal inputted to the signal detector is abnormal, and outputs the determination result for saving in the register module.

According to the zero point control signal provided by the zero point module, the frequency detection module determines a frequency and/or a zero point and/or a phase of the low voltage full wave or half wave signal and/or the mains AC signal inputted to the signal detector, and outputs the determination result for saving in the register module.

The register module saves adjustable variables of the determination results obtained from the voltage detection module and the frequency detection module, for instantly changing the setting of the signal detector. When the voltage detection module determines that the voltage is abnormal and/or the frequency detection module determines that the frequency is abnormal, the register module then outputs an interrupt signal to an external unit of the signal detector (e.g., a CPU), for allowing the external unit to execute a subsequent processing.

The signal detector is adapted for the signal detection method. According to the signal detection method, at first, a signal inputting operation is executed. A low voltage full wave or half wave signal and/or a mains AC signal is inputted into an analog-to-digital converter (ADC) module. The ADC module converts the inputted low voltage full wave or half wave signal and/or the mains AC signal into a digital signal and provides the digital signal to a voltage detection module for determining a voltage level thereof The low voltage full wave or half wave and/or the mains AC signal can be any type of low voltage signal, and the type of the low voltage signal is not restricted hereby. For the convenience of illustration, the low voltage signal is exemplified as a mains voltage signal having a voltage of 110V or 220V and a frequency of 50 Hz or 60 Hz. Then, a low voltage square wave signal is inputted to a zero point module, and the zero point module generates a zero point control signal and provides the zero point control signal to the voltage detection module and a frequency detection module for use. The low voltage square wave signal can be any type of low voltage signal, and the type of the low voltage signal is not restricted hereby. For the convenience of illustration, the low voltage square wave signal is exemplified as a square wave having a frequency equal to an attenuated or unattenuated high voltage signal (e.g., mains power). The low voltage square wave signal has a high level which is a positive half-cycle of the high voltage signal, and a low level which is a negative half-cycle of the high voltage signal. The low voltage square wave signal has a rise edge/fall edge which represents the time that the voltage of the high voltage signal is zero (e.g., zero point).

Then, a signal detection process is executed. According to the zero point control signal provided by the zero point module and the digital signal obtained from the ADC module, the voltage detection module determines whether the low voltage full wave or half wave signal and/or the mains AC signal inputted to the signal detector is abnormal, and outputs the determination result for saving in the register module. According to the zero point control signal provided by the zero point module, the frequency detection module determines a frequency and/or a zero point and/or a phase of the low voltage full wave or half wave signal and/or the mains AC signal inputted to the signal detector, and outputs the determination result for saving in the register module.

Then, the determination results are saved, and/or the setting of the signal detector for detecting voltage is changed, and/or an interrupt signal is outputted. The register module saves adjustable variables of the determination results obtained from the voltage detection module and the frequency detection module, for instantly changing the setting of the signal detector. When the voltage detection module determines that the voltage is abnormal, the register module then outputs an interrupt signal to an external unit of the signal detector (e.g., a CPU), for allowing the external unit to execute a subsequent processing. In this case, the interrupt signal is a voltage abnormal interrupt signal and/or a voltage normal interrupt signal (e.g., a mains voltage abnormal interrupt signal and/or a mains voltage normal interrupt signal). When the frequency detection module determines that the frequency is abnormal, the register module then outputs an interrupt signal to the external unit of the signal detector (e.g., a CPU), for allowing the external unit to execute a subsequent processing. The interrupt signal represents that a frequency abnormal, e.g., mains frequency abnormal.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
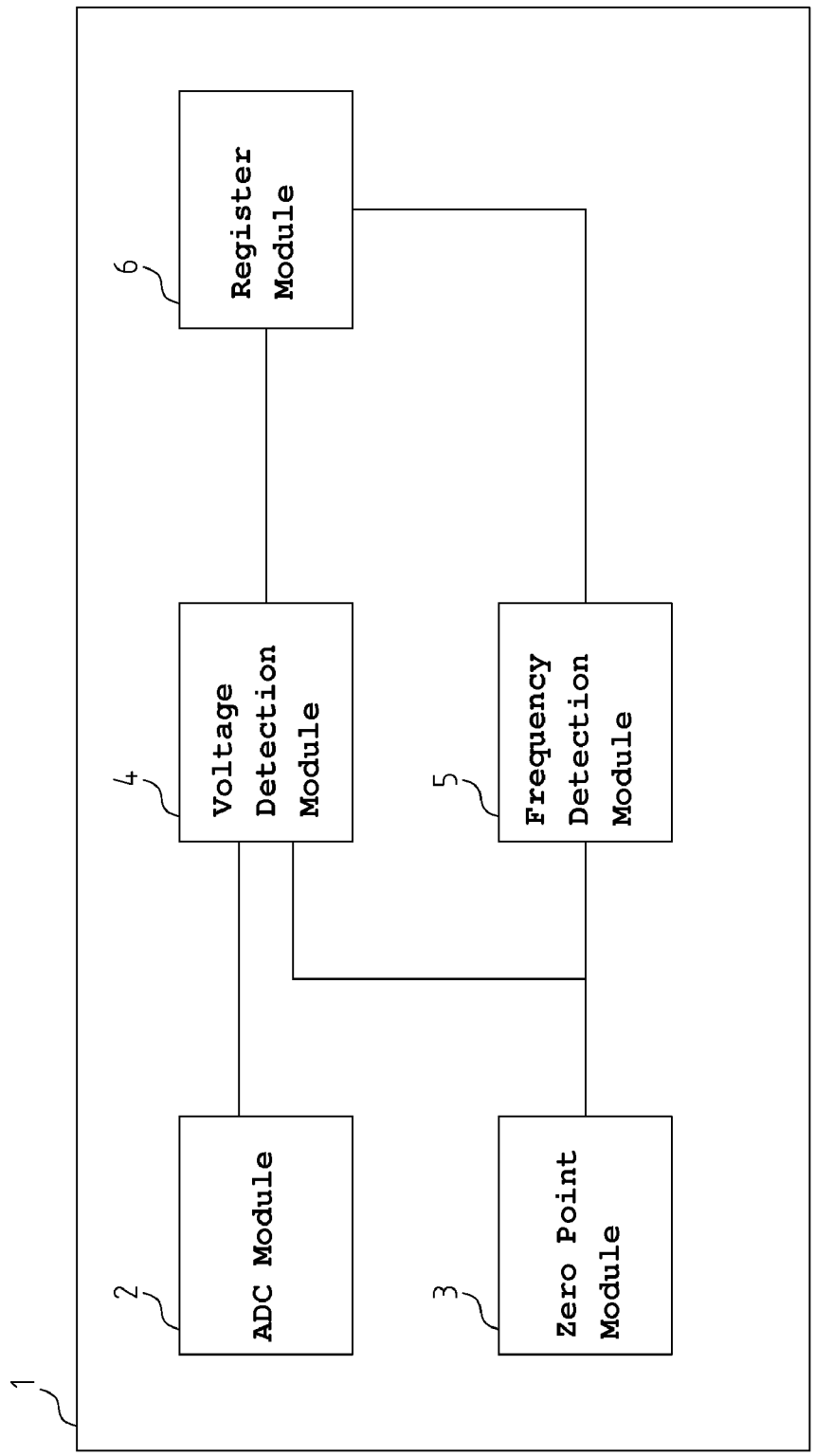
FIG. 1 is a block diagram illustrating an architecture of a signal detector according to an embodiment of the present invention.

FIG. 1 is a block diagram illustrating an architecture of a signal detector according to an embodiment of the present invention. Referring to FIG. 1, a signal detector 1 is shown. The signal detector 1 is configured in a manner of an integrated circuit (IC), and is adapted for integrating with other ICs. For example, the signal detector 1 can be integrated in a micro controller unit (MCU), for improving the integrity of the system. As shown in FIG. 1, the signal detector 1 includes an analog-to-digital converter (ADC) module 2, a zero point module 3, a voltage detection module 4, a frequency detection module 5, and a register module 6. The ADC module 2, the zero point module 3, the voltage detection module 4, the frequency detection module 5, and the register module 6 are IC modules, respectively.

A low voltage full wave or half wave signal and/or a mains AC signal (not shown in the drawings) is inputted to the ADC module 2 and is converted into a digital signal (not shown in the drawings) by the ADC module 2. The digital signal is then provided to the voltage detection module 4 for detecting a voltage level thereof. The low voltage full wave or half wave and/or the mains AC signal can be any type of low voltage signal, and the type of the low voltage signal is not restricted hereby. For the convenience of illustration, the low voltage signal is exemplified as a mains voltage signal having a voltage of 110V or 220V and a frequency of 50 Hz or 60 Hz.

A low voltage square wave signal (not shown in the drawings) is inputted to the zero point module 3, and the zero point module 3 generates a zero point control signal (not shown in the drawings). The zero point control signal is then provided to the voltage detection module 4, the frequency detection module 5 for use. The low voltage square wave signal can be any type of low voltage signal, and the type of the low voltage signal is not restricted hereby. For the convenience of illustration, the low voltage square wave signal is exemplified as a square wave having a frequency equal to an attenuated or unattenuated high voltage signal (e.g., mains power). The low voltage square wave signal has a high level which is a positive half-cycle of the high voltage signal, and a low level which is a negative half-cycle of the high voltage signal. The low voltage square wave signal has a rise edge/fall edge which represents the time that the voltage of the high voltage signal is zero (e.g., zero point).

According to the zero point control signal provided by the zero point module 3 and the digital signal obtained from the ADC module 2, the voltage detection module 4 determines whether the low voltage full wave or half wave signal and/or the mains AC signal inputted to the signal detector 1 is abnormal, and outputs the determination result for saving in the register module 6.

According to the zero point control signal provided by the zero point module 3, the frequency detection module 5 determines a frequency and/or a zero point and/or a phase of the low voltage full wave or half wave signal and/or the mains AC signal inputted to the signal detector 1, and outputs the determination result for saving in the register module 6.

The register module 6 saves adjustable variables of the determination results obtained from the voltage detection module 4 and the frequency detection module 5, for instantly changing the voltage signal detection setting of the signal detector 1. When the voltage detection module 4 determines that the voltage is abnormal and/or the frequency detection module 5 determines that the frequency is abnormal, the register module 6 then outputs an interrupt signal (not shown in the drawings) to an external unit (not shown in the drawings) of the signal detector 1, (e.g., a CPU), for allowing the external unit to execute a subsequent processing.

Figure 2:
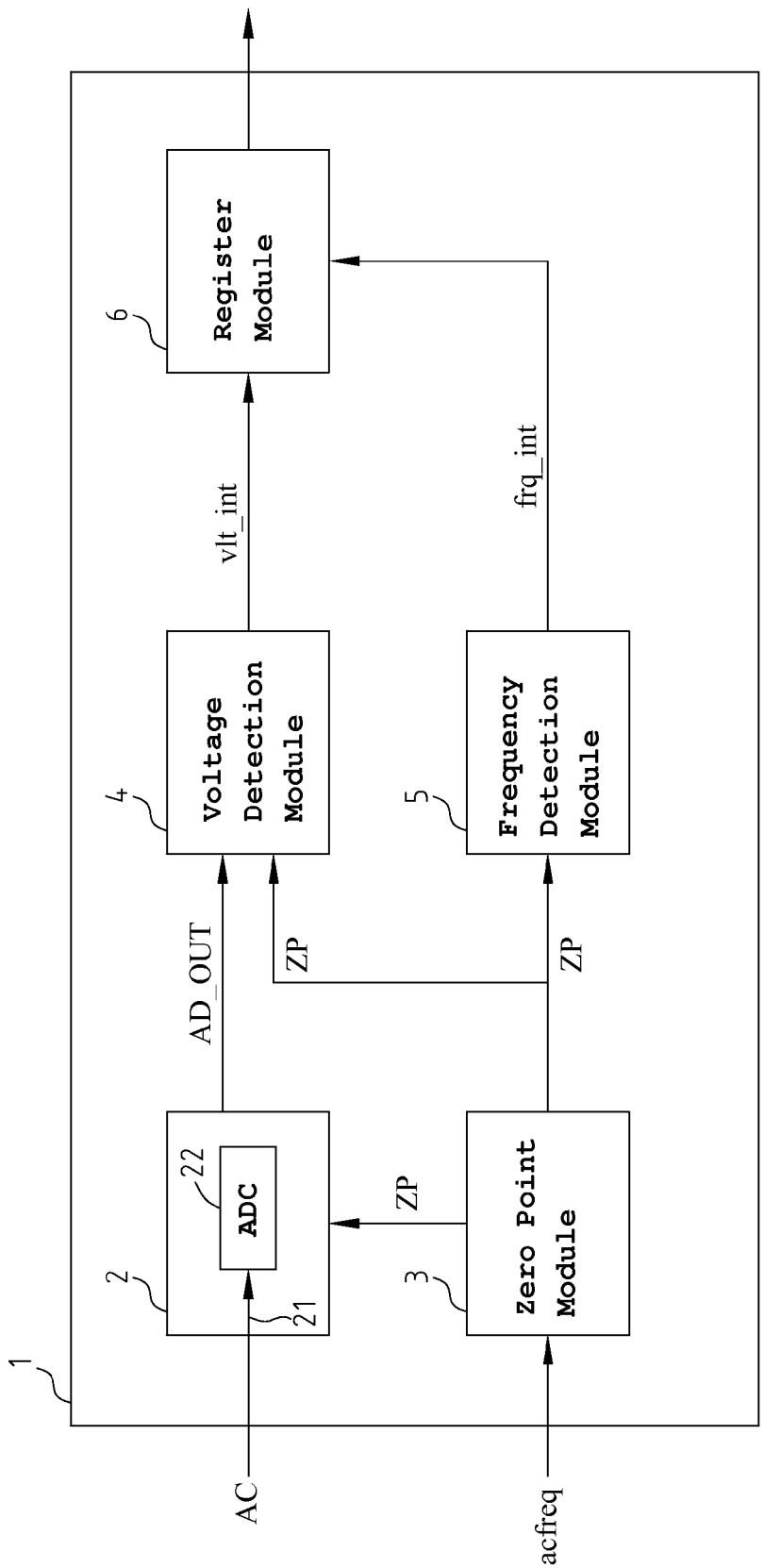
FIG. 2 is a block diagram illustrating the structure and the operation of the signal detector according to an embodiment of the present invention.

FIG. 2 is a block diagram illustrating the structure and the operation of the signal detector according to an embodiment of the present invention. Referring to FIG. 2, the signal detector 1 includes an analog-to-digital converter (ADC) module 2, a zero point module 3, a voltage detection module 4, a frequency detection module 5, and a register module 6. As shown in FIG. 2, an unattenuated mains AC signal is inputted to an input terminal 21 of the ADC module 2.

Figure 3:
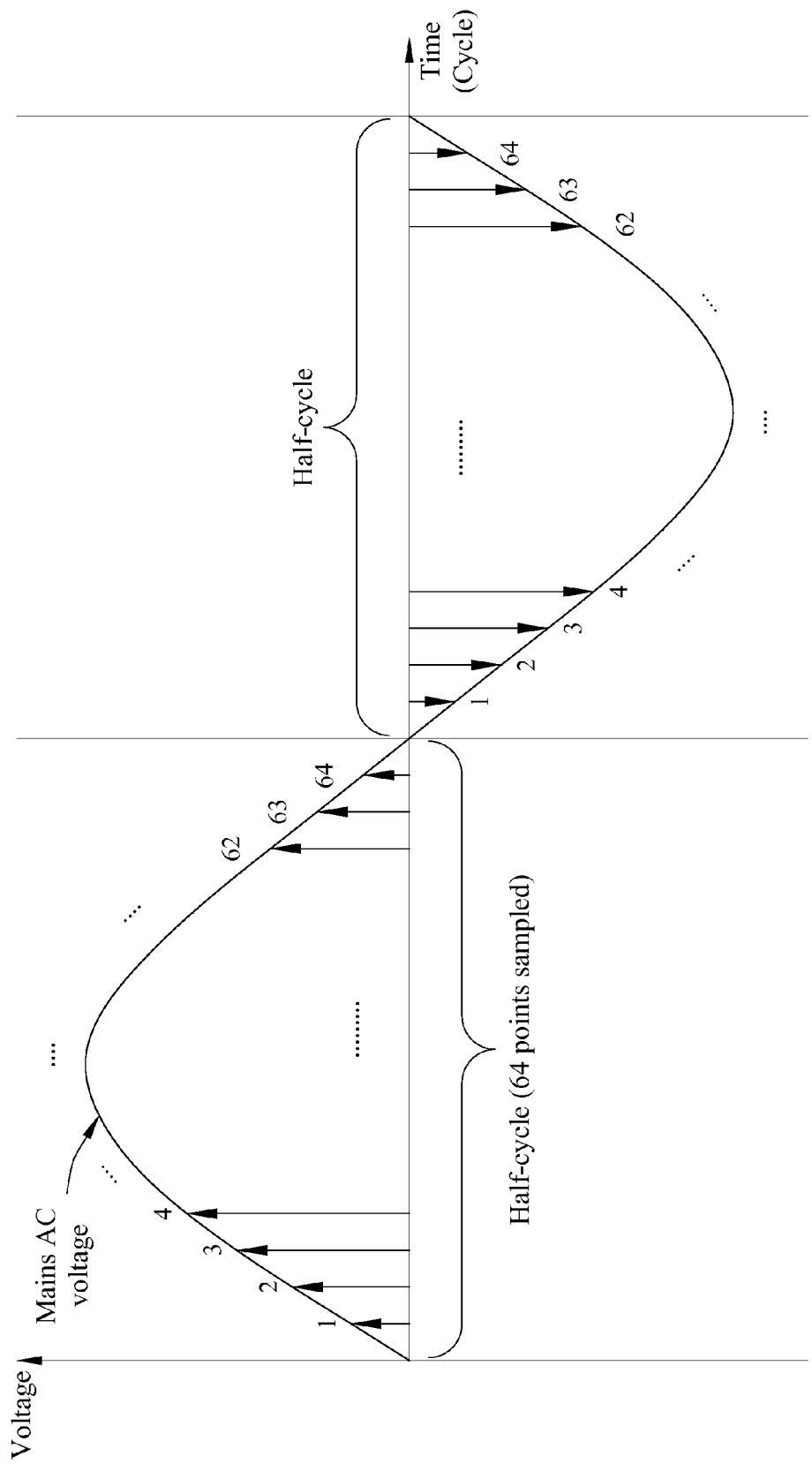
FIG. 3 is schematic diagram illustrating the sampling operation of the signal detector of FIG. 2.

The ADC module 2 converts the inputted mains AC signal into a digital signal AD_OUT, and provides the digital signal AD_OUT to the voltage detection module 4. The voltage detection module 4 detects the voltage level of the digital signal AD_OUT. The zero point module 3 provides a zero point control signal ZP to the ADC module 2. According to the zero point control signal ZP, the ADC module 2 generates a request sampling signal (not shown in the drawings). According to the request sampling signal, the mains AC signal is sampled for 64 times per half-cycle, i.e., sampling 64 points as shown in FIG. 3. Subsequently, the sampled 64 points can be used for determining whether the mains AC voltage is normal or abnormal. The ADC module 2 includes an ADC sub-module 22. When the ADC sub-module 22 receives the request sampling signal, the ADC sub-module 22 outputs a sampling completion signal (not shown in the drawings) and a sampling figure (i.e., the digital signal AD_OUT) after a certain number of clock pulses. The ADC module 2 saves the sampling figure (the digital signal AD_OUT) for outputting to the voltage detection module 4 for use.

A low voltage square wave signal acfreq is inputted to the zero point module 3. Then the zero point module 3 generates the zero point control signal ZP, and provides the zero point control signal ZP to the voltage detection module 4 and the frequency detection module 5 for use. The low voltage square wave signal acfreq is a square wave having a frequency equal to an attenuated or an unattenuated high voltage signal (i.e., mains AC signal). The low voltage square wave signal acfreq has a high level which is a positive half-cycle of the high voltage signal (the mains AC signal), and a low level which is a negative half-cycle of the high voltage signal (the mains AC signal). The low voltage square wave signal has a rise edge/fall edge which represents the time that the voltage of the high voltage signal (the mains AC signal) is zero (e.g., zero point). The zero point signal (i.e., the zero point control signal ZP) of the mains AC signal is a most important signal for frequency detection and voltage detection, and is absolutely related to the correctness of the determination results, and therefore is known as a very critical control signal.

Figure 4:
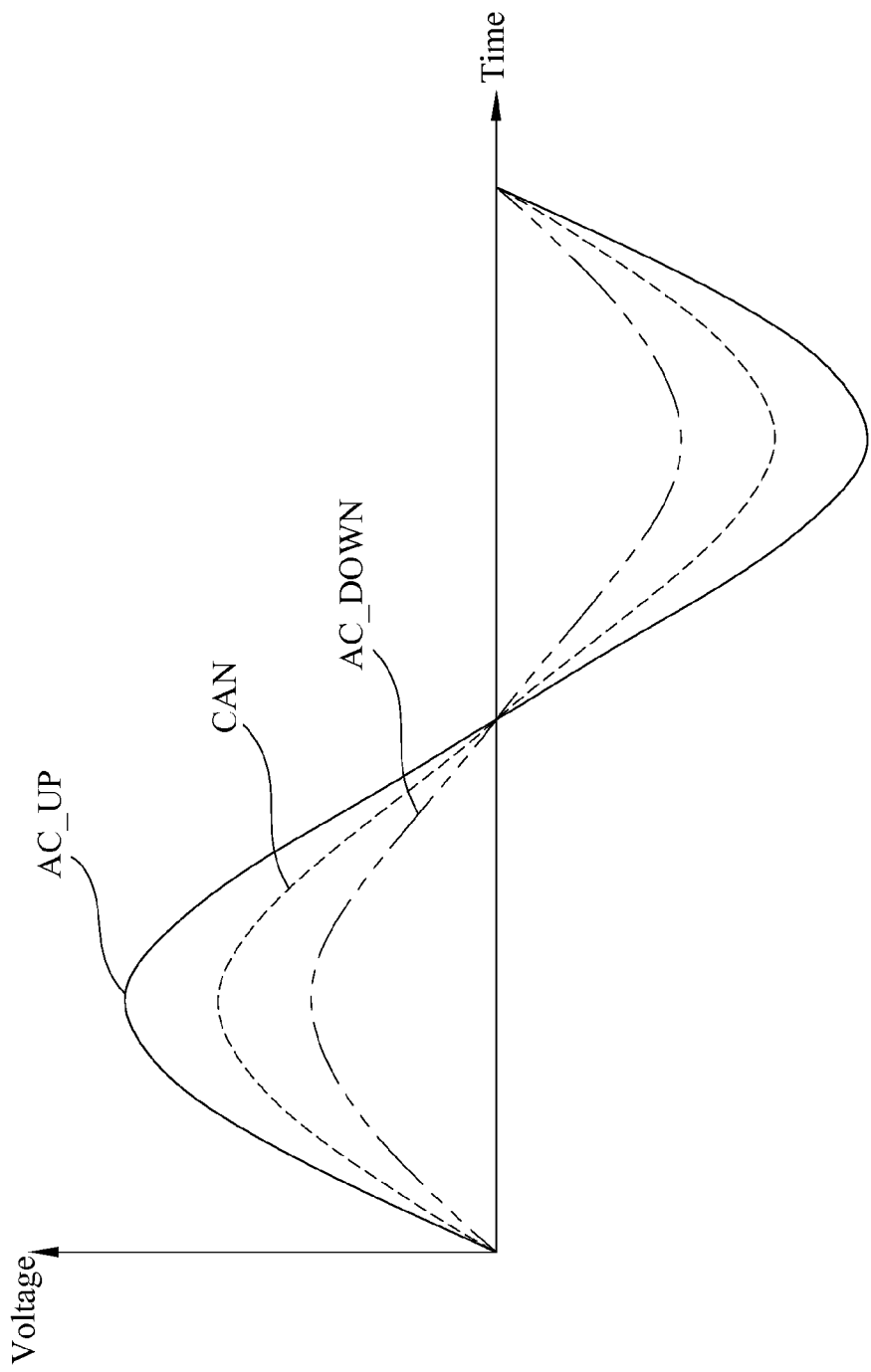
FIG. 4 is a schematic diagram illustrating a mains AC signal waveform, a normal mains AC signal upper threshold voltage waveform, and a normal mains AC signal lower threshold waveform.

According to the zero point control signal ZP obtained from the zero point module 3, and the digital signal AD_OUT obtained from the ADC module 2, the voltage detection module 4 determines whether the mains AC signal inputted to the signal detector is abnormal, and outputs the determination result for saving in the register module 6. According to the digital signal AD_OUT obtained from the ADC module 2, the voltage detection module 4 samples the 64 points per half-cycle, thus obtaining a voltage waveform of the mains AC signal represented with 64 points per half-cycle as shown in FIG. 3. Meanwhile, the voltage detection module 4 generates a 64-point ideal waveform (not shown in the drawings). Then, an upper threshold (not shown in the drawings) and a lower threshold (not shown in the drawings) of the normal mains AC voltage are obtained according to an ideal voltage value (not shown in the drawings) presented in by the ideal waveform. FIG. 4 is a schematic diagram illustrating a mains AC signal waveform, a normal mains AC signal upper threshold voltage waveform, and a normal mains AC signal lower threshold waveform. Referring to FIG. 4, a 64-point normal mains AC upper threshold voltage waveform AC_UP, a 64-point normal mains AC lower threshold voltage waveform AC_DOWN, and a mains AC signal waveform CAN are shown. According to the 64-point normal mains AC upper threshold voltage waveform AC_UP, the 64-point normal mains AC lower threshold voltage waveform AC_DOWN, and the mains AC signal waveform CAN, any mains AC voltage abnormality can be detected.

A window can be used as a criterion of determining the mains AC voltage abnormality. The size of the window can be selected according to the setting of the register 6. For example 60 points or 30 points can be selected as the window. When the window is set with a size of 50 points, the range from the $8^{th}$ point to the $57^{th}$ point and the sampling voltage waveform (the digital signal AD_OUT) will be compared with the upper threshold voltage waveform AC_UP, and the lower threshold voltage waveform AC_DOWN.

When the sampling voltage waveform (the digital signal AD_OUT) is higher than the upper threshold voltage waveform for more than a certain number of successive points, the mains AC voltage is determined as too high which is attributed as a situation of mains power abnormality. The certain number can be selected by the register module 6. Meanwhile, the voltage detection module 4 outputs an interrupt signal vlt_int to the register module 6, for informing an external unit (e.g., a CPU) for executing a subsequent processing.

When the sampling voltage waveform (the digital signal AD_OUT) is lower than the lower threshold voltage waveform for more than a certain number of successive points, the mains AC voltage is determined as too low which is attributed as another situation of mains power abnormality. The certain number can be selected by the register module 6. Meanwhile, the voltage detection module 4 outputs an interrupt signal vlt_int to the register module 6, for informing an external unit (e.g., a CPU) for executing a subsequent processing.

According to the zero point control signal ZP, the frequency detection module 5 is capable of determining the frequency and/or the zero point and/or the phase of the mains AC signal inputted to the signal detector 1, and the determination results are outputted to the register module 6 and saved therein. The frequency detection module 5 is adapted for determining the frequency of the mains AC signal according to the zero point control signal ZP. In determining the frequency of the mains AC signal, when receiving the zero point control signal ZP, a counter of the frequency detection module 5 is reset to zero, and then the counter remains increasing until the zero point control signal is received again. The counter is then reset to zero again, and the value counted by the counter is saved.

The clock pulse of the system is a fixed clock pulse, and therefore the value counted by the counter can be converted into time. For example, if the system clock pulse is 2 microseconds, and the value counted by the counter is 5000, the time converted thereby is 10 milliseconds. As such, a half-cycle is 10 milliseconds, and a full-cycle is 20 milliseconds. Therefore, the frequency of the mains AC signal is 50 Hz.

Compared with an ideal frequency, when determined as too high or too low, the obtained frequency is determined as abnormal. The ideal frequency can be selected by the register module 6, e.g., 50 Hz or 60 Hz. When the mains AC signal is determined with a voltage abnormality, the frequency detection module 5 outputs an interrupt signal frq_int to the register module 6, for informing the external unit (e.g., the CPU) for executing the subsequent processing.

The register module 6 saves adjustable variables of the determination results obtained from the voltage detection module 4 and the frequency detection module 5, for instantly changing the voltage signal detection setting of the signal detector 1. The adjustable variables include 110V or 220V mains AC voltage, 60 Hz or 50 Hz mains AC frequency, starting control bytes (not shown in the drawings) of mains AC abnormality detection, control bytes for abnormal interruption. When the interrupt signal vlt_int obtained received from the voltage detection module 4 indicates that the voltage is abnormal and/or the interrupt signal frq_int received from the frequency detection module 5 indicates that the frequency is abnormal, the register module 6 then outputs an interrupt signal (not shown in the drawings) to an external unit (not shown in the drawings) of the signal detector 1, (e.g., a CPU), for allowing the external unit to execute a subsequent processing.

FIG. 3 is schematic diagram illustrating the sampling operation of the signal detector of FIG. 2. Referring to FIG. 3, the ADC module 2 samples 64 times, i.e., 64 points, per half-cycle of the mains AC signal. The 64-points sampling result can be subsequently relied upon for determining whether the mains AC voltage is normal or abnormal.

FIG. 4 is a schematic diagram illustrating a mains AC signal waveform CAN, a normal mains AC signal upper threshold voltage waveform AC_UP, and a normal mains AC signal lower threshold waveform AC_DOWN. According to the digital signal AD_OUT obtained from the ADC module 2, the voltage detection module 4 samples 64 points per half-cycle, thus obtaining the 64-points voltage waveform of each half-cycle of the mains AC signal, as shown in FIG. 3. Meanwhile, the voltage detection module 4 generates a 64-points ideal voltage waveform (not shown in the drawings), according to which the upper threshold and the lower threshold of the normal mains AC voltage.

Referring to FIG. 4, there are shown the upper threshold voltage waveform AC_UP, and the lower threshold voltage waveform AC_DOWN of the 64-point normal mains AC signal, respectively. According to the mains AC waveform CAN, the upper threshold voltage waveform AC_UP, and the lower threshold voltage waveform AC_DOWN of the 64-point normal mains AC signal, any abnormality of the mains AC voltage can be detected.

Figure 5:
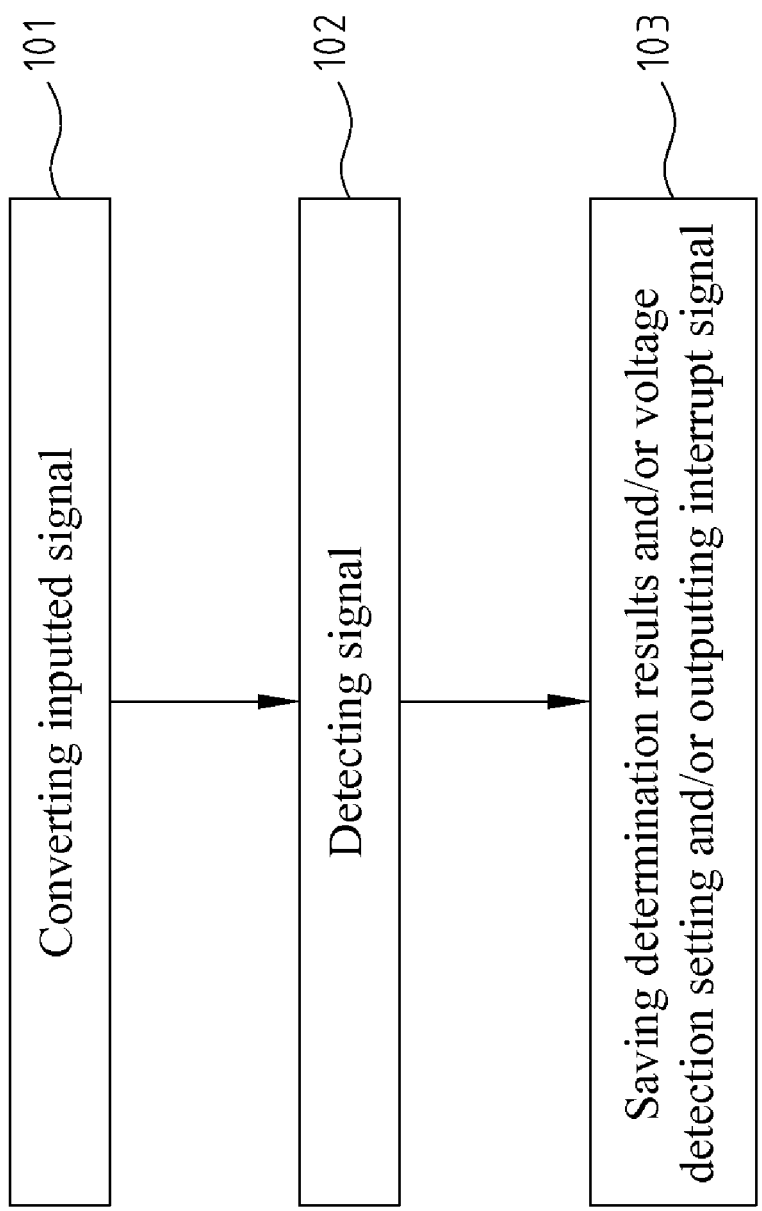
FIG. 5 is a flow chart illustrating a signal detection method executed with the signal detector according to an embodiment of the present invention.

FIG. 5 is a flow chart illustrating a signal detection method executed with the signal detector according to an embodiment of the present invention. Referring to FIG. 5, at step 101, at first, a signal inputting operation is executed. A low voltage full wave or half wave signal and/or a mains AC signal (not shown in the drawings) are inputted into the analog-to-digital converter (ADC) module 2. The ADC module 2 converts the inputted low voltage full wave or half wave signal and/or the mains AC signal into a digital signal AD_OUT and provides the digital signal AD_OUT to the voltage detection module 4 for determining a voltage level thereof The low voltage full wave or half wave and/or the mains AC signal can be any type of low voltage signal, and the type of the low voltage signal is not restricted hereby. For the convenience of illustration, the low voltage signal is exemplified as a mains voltage signal having a voltage of 110V or 220V and a frequency of 50 Hz or 60 Hz. Then, a low voltage square wave signal acfreq is inputted to the zero point module 3, and the zero point module 3 generates a zero point control signal ZP and provides the zero point control signal ZP to the voltage detection module 4 and a frequency detection module 5 for use. The low voltage square wave signal acfreq can be any type of low voltage signal, and the type of the low voltage signal is not restricted hereby. For the convenience of illustration, the low voltage square wave signal acfreq is exemplified as a square wave having a frequency equal to an attenuated or unattenuated high voltage signal (e.g., mains power). The low voltage square wave signal acfreq has a high level which is a positive half-cycle of the high voltage signal, and a low level which is a negative half-cycle of the high voltage signal. The low voltage square wave signal acfreq has a rise edge/fall edge which represents the time that the voltage of the high voltage signal is zero (e.g., zero point). Then the procedure enters step 102.

At step 102, a signal detection process is executed. According to the zero point control signal ZP provided by the zero point module 3 and the digital signal AD_OUT obtained from the ADC module 2, the voltage detection module 4 determines whether the low voltage full wave or half wave signal and/or the mains AC signal inputted to the signal detector 1 is abnormal, and outputs the determination result for saving in the register module 6. According to the zero point control signal ZP provided by the zero point module 3, the frequency detection module 5 determines a frequency and/or a zero point and/or a phase of the low voltage full wave or half wave signal and/or the mains AC signal inputted to the signal detector 1, and outputs the determination result for saving in the register module 6. Then the procedure enters step 103.

At step S103, the determination results are saved, and/or the setting of the signal detector for detecting voltage is changed, and/or an interrupt signal is outputted. The register module 6 saves adjustable variables of the determination results obtained from the voltage detection module 4 and the frequency detection module 5, for instantly changing the setting of the signal detector 1. When the voltage detection module 4 determines that the voltage is abnormal, and/or the frequency detection module 5 determines that the frequency is abnormal, the register module 6 then outputs an interrupt signal to an external unit of the signal detector 1 (e.g., a CPU), for allowing the external unit to execute a subsequent processing. In this case, the interrupt signal is a voltage abnormal interrupt signal and/or a voltage normal interrupt signal (e.g., a mains voltage abnormal interrupt signal and/or a mains voltage normal interrupt signal). When the frequency detection module determines that the frequency is abnormal, the register module then outputs an interrupt signal to the external unit of the signal detector (e.g., a CPU), for allowing the external unit to execute a subsequent processing. The interrupt signal represents that a frequency abnormal, e.g., mains frequency abnormal.

Figure 6:
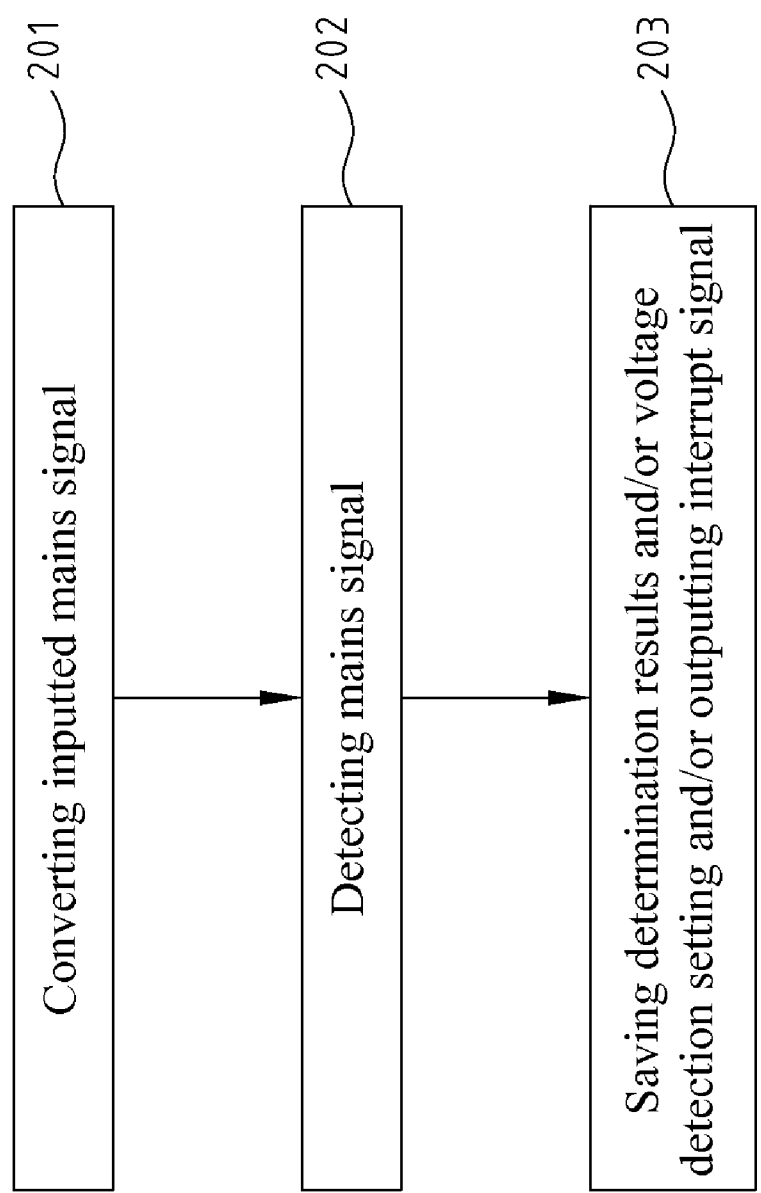
FIG. 6 is a flow chart illustrating a signal detection method executed with the signal detector according to another embodiment of the present invention.

FIG. 6 is a flow chart illustrating a signal detection method executed with the signal detector according to another embodiment of the present invention. Referring to FIG. 6, at step 201, at first, a signal inputting and processing operation is executed. The ADC module 2 converts the inputted mains AC signal into a digital signal AD_OUT, and provides the digital signal AD_OUT to the voltage detection module 4. The voltage detection module 4 detects the voltage level of the digital signal AD_OUT. The zero point module 3 provides a zero point control signal ZP to the ADC module 2. According to the zero point control signal ZP, the ADC module 2 generates a request sampling signal (not shown in the drawings). The request sampling signal is generated corresponding to each half-cycle of the mains AC signal, for subsequently determining whether the mains AC voltage is normal or abnormal. The ADC module 2 includes an ADC sub-module 22. When the ADC sub-module 22 receives the request sampling signal, the ADC sub-module 22 outputs a sampling completion signal (not shown in the drawings) and a sampling figure (i.e., the digital signal AD_OUT) after a certain number of clock pulses. The ADC module 2 saves the sampling figure (the digital signal AD_OUT) for outputting to the voltage detection module 4 for use. A low voltage square wave signal acfreq is inputted to the zero point module 3. Then the zero point module 3 generates the zero point control signal ZP, and provides the zero point control signal ZP to the voltage detection module 4 and the frequency detection module 5 for use. The low voltage square wave signal acfreq is a square wave having a frequency equal to an attenuated or an unattenuated high voltage signal (i.e., mains AC signal). Then the procedure enters step 202.

Then at step 202, a signal detection process is executed. According to the zero point control signal ZP obtained from the zero point module 3, and the digital signal AD_OUT obtained from the ADC module 2, the voltage detection module 4 determines whether the mains AC signal inputted to the signal detector 1 is abnormal, and outputs the determination result for saving in the register module 6. According to the digital signal AD_OUT obtained from the ADC module 2 and the ideal voltage value (not shown in the drawings), the voltage detection module 4 obtains a normal mains AC upper threshold voltage waveform AC_UP, a normal mains AC lower threshold voltage waveform AC_DOWN. According to the normal mains AC upper threshold voltage waveform AC_UP, the normal mains AC lower threshold voltage waveform AC_DOWN, and the mains AC signal waveform CAN, any mains AC voltage abnormality can be detected.

A window can be used as a criterion of determining the mains AC voltage abnormality. The size of the window can be selected according to the setting of the register 6. For example 60 points or 30 points can be selected as the window. When the window is set with a size of 50 points, the range from the 8$^{th}$ point to the 57$^{th}$ point and the sampling voltage waveform (the digital signal AD_OUT) will be compared with the upper threshold voltage waveform AC_UP, and the lower threshold voltage waveform AC_DOWN.

When the sampling voltage waveform (the digital signal AD_OUT) is higher than the upper threshold voltage waveform for more than a certain number of successive points, the mains AC voltage is determined as too high which is attributed as a situation of mains power abnormality. The certain number can be selected by the register module 6. Meanwhile, the voltage detection module 4 outputs an interrupt signal vlt_int to the register module 6, for informing an external unit (e.g., a CPU) for executing a subsequent processing.

When the sampling voltage waveform (the digital signal AD_OUT) is lower than the lower threshold voltage waveform for more than a certain number of successive points, the mains AC voltage is determined as too low which is attributed as another situation of mains power abnormality. The certain number can be selected by the register module 6. Meanwhile, the voltage detection module 4 outputs an interrupt signal vlt_int to the register module 6, for informing an external unit (e.g., a CPU) for executing a subsequent processing.

According to the zero point control signal ZP, the frequency detection module 5 is capable of determining the frequency and/or the zero point and/or the phase of the mains AC signal inputted to the signal detector 1, and the determination results are outputted to the register module 6 and saved therein. The frequency detection module 5 is adapted for determining the frequency of the mains AC signal according to the zero point control signal ZP. In determining the frequency of the mains AC signal, when receiving the zero point control signal ZP, a counter of the frequency detection module 5 is reset to zero, and then the counter remains increasing until the zero point control signal is received again. The counter is then reset to zero again, and the value counted by the counter is saved.

Compared with an ideal frequency, when determined as too high or too low, the obtained frequency is determined as abnormal. The ideal frequency can be selected by the register module 6, e.g., 50 Hz or 60 Hz. When the mains AC signal is determined with a voltage abnormality, the frequency detection module 5 outputs an interrupt signal frq_int to the register module 6, for informing the external unit (e.g., the CPU) for executing the subsequent processing. Then the procedure enters step 203.

At step 203, the determination results are saved, and/or the setting of the signal detector for detecting voltage is changed, and/or an interrupt signal is outputted. The register module 6 saves adjustable variables of the determination results obtained from the voltage detection module 4 and the frequency detection module 5, for instantly changing the voltage signal detection setting of the signal detector 1. The adjustable variables include 110V or 220V mains AC voltage, 60 Hz or 50 Hz mains AC frequency, starting control bytes (not shown in the drawings) of mains AC abnormality detection, control bytes for abnormal interruption. When the interrupt signal vlt_int obtained received from the voltage detection module 4 indicates that the voltage is abnormal and/or the interrupt signal frq_int received from the frequency detection module 5 indicates that the frequency is abnormal, the register module 6 then outputs an interrupt signal (not shown in the drawings) to an external unit (not shown in the drawings) of the signal detector 1, (e.g., a CPU), for allowing the external unit to execute a subsequent processing.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A signal detector, adapted for a voltage signal detecting environment, comprising:
   an analog-to-digital converter (ADC) module, receiving a signal inputted to the signal detector and converting the signal inputted to the signal detector into a digital signal;
   a zero point module, receiving a low voltage square wave signal and generating a zero point control signal;
   a voltage detection module, receiving the digital signal from the ADC module and the zero point control signal from the zero point module, and determining whether a voltage of the signal inputted to the signal detector is abnormal according to the zero point control signal and the digital signal;
   a frequency detection module, receiving the zero point control signal and determining a frequency and/or a zero point and/or a phase of the signal inputted to the signal detector according to the zero point control signal; and
   a register module, saving variable factors received from the voltage detection module and/or the frequency detection module, for adjusting the setting of the signal detector.

2. The signal detector according to claim 1, wherein the signal received by the ADC module is a low voltage full wave signal.

3. The signal detector according to claim 1, wherein the signal received by the ADC module is a mains voltage signal.

4. The signal detector according to claim 1, wherein the low voltage square wave signal has a frequency equal to a frequency of a mains frequency.

5. The signal detector according to claim 1, wherein when the voltage detection module determines that the voltage of the signal inputted to the signal detector is abnormal, the register module outputs an interrupt signal to an external unit of the signal detector for subsequent processing.

6. The signal detector according to claim 1, wherein when the frequency detection module determines that the frequency of the signal inputted to the signal detector is abnormal, the register module outputs an interrupt signal to an external unit of the signal detector for subsequent processing.

7. The signal detector according to claim 1, wherein the signal detector is configured in an integrated circuit (IC) manner.

8. The signal detector according to claim 7, wherein the signal detector is integrated in a micro-controller unit (MCU).

9. A signal detection method, adapted for detecting a signal inputted to a signal detector, comprising:
   inputting a signal to an analog-to-digital converter (ADC) module, wherein the ADC module converts the signal into a digital signal and outputs the digital signal to a voltage detection module for determining a voltage level of the signal;
   inputting a low voltage square wave signal to a zero point module, wherein the zero point module generates a zero point control signal and provides the zero point control signal to the voltage detection module and a frequency detection module for use;
   the voltage detection module determining a voltage of the signal inputted to the signal detector according to the zero point control signal received from the zero point module and the digital signal received from the ADC module, and outputting the determination result to a register module for saving therein, and/or the frequency detection module determining a frequency and/or a zero point and/or a phase of the signal inputted to the signal detector according to the zero point control signal received from the zero point module, and outputting the determination result to the register module for saving therein; and
   the register module saving variable factors received from the voltage detection module and/or the frequency detection module, for instantly adjusting the setting of the signal detector.

10. The method according to claim 9, wherein the signal received by the ADC module is a low voltage full wave signal.

11. The method according to claim 9, wherein the signal received by the ADC module is a mains voltage signal.

12. The method according to claim 9, wherein the low voltage square wave signal has a frequency equal to a frequency of a mains frequency.

13. The method according to claim 9, wherein when the voltage detection module determines that the voltage of the signal inputted to the signal detector is abnormal, the register module outputs an interrupt signal to an external unit of the signal detector for subsequent processing.

14. The method according to claim 9, wherein when the frequency detection module determines that the frequency of the signal inputted to the signal detector is abnormal, the register module outputs an interrupt signal to an external unit of the signal detector for subsequent processing.

15. The method according to claim 9, wherein the signal detector is configured in an integrated circuit (IC) manner.

16. The method according to claim 15, wherein the signal detector is integrated in a micro-controller unit (MCU).

* * * * *